(12) United States Patent
Chai et al.

(10) Patent No.: US 8,154,900 B2
(45) Date of Patent: Apr. 10, 2012

(54) METHOD AND APPARATUS FOR REDUCING POWER CONSUMPTION IN A CONTENT ADDRESSABLE MEMORY

(75) Inventors: Chiaming Chai, Chapel Hill, NC (US); Jeffrey Herbert Fischer, Cary, NC (US); Michael Thai Thanh Phan, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/569,537

(22) Filed: Sep. 29, 2009

(65) Prior Publication Data
US 2010/0023684 A1 Jan. 28, 2010

Related U.S. Application Data

(62) Division of application No. 11/462,455, filed on Aug. 4, 2006, now Pat. No. 7,616,468.

(51) Int. Cl.
*G11C 15/00* (2006.01)
(52) U.S. Cl. .................... 365/49.1; 365/49.17
(58) Field of Classification Search ............ 365/49, 365/49.1–49.18, 50, 154, 189.07; 711/108
See application file for complete search history.

(56) References Cited

U.S. PATENT DOCUMENTS

| | | | |
|---|---|---|---|
| 5,034,919 A | 7/1991 | Sasai et al. | |
| 5,130,947 A | 7/1992 | Reed | |
| 5,294,911 A | 3/1994 | Uchida et al. | |
| 5,327,372 A | 7/1994 | Oka et al. | |
| 6,166,939 A | 12/2000 | Nataraj et al. | |
| 6,191,969 B1 | 2/2001 | Pereira | |
| 6,191,970 B1* | 2/2001 | Pereira | 365/49.1 |
| 6,243,280 B1* | 6/2001 | Wong et al. | 365/49.17 |
| 6,262,929 B1 | 7/2001 | Miyatake et al. | |
| 6,768,659 B2* | 7/2004 | Gillingham et al. | 365/49.16 |
| 7,050,318 B1 | 5/2006 | Argyres | |
| 7,113,415 B1* | 9/2006 | Khanna | 365/49.16 |
| 7,616,468 B2 | 11/2009 | Chai et al. | |
| 2002/0163823 A1 | 11/2002 | Edman et al. | |
| 2004/0145934 A1* | 7/2004 | Arsovski et al. | 365/49 |
| 2006/0146585 A1 | 7/2006 | Nisha Padattil | |
| 2006/0181908 A1* | 8/2006 | Chan et al. | 365/49 |

FOREIGN PATENT DOCUMENTS

EP 0918335 A2 5/1999
(Continued)

OTHER PUBLICATIONS

K. Pagiamtzis and A. Sheikholeslami, "Content-Addressable Memory (CAM) Circuits and Architectures: A Tutorial and Survey," IEEE Journal of Solid-State Circuits, vol. 41, No. 3 Mar. 2006, pp. 712-727.*

(Continued)

*Primary Examiner* — Richard Elms
*Assistant Examiner* — Harry W Byrne
(74) *Attorney, Agent, or Firm* — Peter M. Kamarchik; Nicholas J. Pauley; Jonathan T. Velasco

(57) ABSTRACT

Power consumption in a Content Addressable Memory (CAM) circuit is reduced by use of a CAM circuit. According to one embodiment of the CAM circuit, the CAM circuit includes a plurality of match lines and match line restoration circuitry. The match line restoration circuitry is configured to prevent at least one of the match lines from being restored to a pre-evaluation state responsive to corresponding enable information.

15 Claims, 5 Drawing Sheets

FOREIGN PATENT DOCUMENTS

| | | | |
|---|---|---|---|
| JP | 2308499 | A | 12/1990 |
| JP | 5127872 | A | 5/1993 |
| JP | 5282877 | A | 10/1993 |
| JP | 2000228090 | A | 8/2000 |
| JP | 2001167585 | A | 6/2001 |
| RU | 2087031 | C1 | 8/1997 |
| WO | WO03050819 | A1 | 6/2003 |
| WO | WO2008019274 | | 2/2008 |

OTHER PUBLICATIONS

"Content Addressable Memory Match Line Power Reduction" IBM Technical Disclosure Bulletin, IBM Corp. New York, U.S., vol. 36, No. 1; Jan. 1993, pp. 200-202, XP000333827, p. 201, last paragraph; figure 1.

Hideyuki Noda et al.,"A Cost-Efficient High-Performance Dynamic TCAM With Pipelined Hierarchical Searching and Shift Redundancy Architecture", IEEE Journal of Solid-State Circuits, vol. 40, No. 1, Jan. 2005.

International Search Report and Written Opinion—PCT/US2007/074999, International Search Authority—European Patent Office—Jan. 21, 2008.

K. Pagiamtzis et al. :"A Low-Power Content-Addressable Memory (CAM) Using Pipelined Hierarchical Search Scheme," IEEE Journal of Solid-State Circuits, vol. 39, No. 9, Sep. 2004, pp. 1512-1519.

* cited by examiner

METHOD AND APPARATUS FOR REDUCING POWER CONSUMPTION IN A CONTENT ADDRESSABLE MEMORY

CLAIM OF PRIORITY

The present application claims priority from and is a divisional of patent application Ser. No. 11/462,455 filed on Aug. 4, 2006 and entitled "Method And Apparatus For Reducing Power Consumption In A Content Addressable Memory," the contents of which are expressly incorporated herein by reference in their entirety.

FIELD OF THE INVENTION

The present invention generally relates to Content Addressable Memories (CAMs), and particularly relates to reducing CAM power consumption.

BACKGROUND

Unlike Random Access Memory (RAM) in which the RAM returns a data word stored at an address supplied to the RAM, a Content Addressable Memory (CAM) searches its entire memory for a data pattern that matches a search word input to the CAM. If the data pattern is found, the CAM returns a list of one or more storage addresses where the word was found. In some CAMs, the data word or other associated data is also returned. Thus, CAMs are often used an associative array.

CAMs comprise a plurality of entries, each entry having a number of CAM cells configured to store data. The CAM cells may be binary (store binary data) or ternary (store binary data or a 'don't care' state). Each CAM cell is coupled to a match line. During a CAM search operation, a search field is provided to the CAM. In response to the search field input, each match line indicates whether its respective CAM cell contains data matching some portion of the search field. After the search operation completes, match lines are conventionally restored to a pre-evaluation state to improve CAM performance during a subsequent search. For example, match lines are conventionally pre-charged high to a logic one value during a pre-evaluation period.

During a subsequent CAM search operation, match lines associated with CAM cells that do not contain matching data are discharged. Only those match lines coupled to CAM cells that store matching data remain charged high. As such, only one CAM cell associated with an entry need contain mismatching data for the entry to be identified as containing a mismatched data pattern. This is referred to as a miss. Conversely, if each cell in an entry yields a match, the entry is identified as containing a matching pattern, which is referred to as a hit.

Some conventional CAMs contain multiple levels of hierarchical match lines for reducing capacitive loading on the match lines, which affects CAM performance and power consumption. In such multi-level hierarchical CAMs, local match lines serving a group of CAM cells are coupled to a single global match line. A mismatch indicated by one or more local match lines is reflected by the corresponding global match line. As such, a global match line indicates a miss if any one of its corresponding local match lines indicates a miss. Conversely, the global match line indicates a hit if all of its corresponding local match lines indicate a hit. Depending on CAM size, one or more intermediary levels of match lines may be included between local match lines and a corresponding global match line to further reduce capacitive loading.

Regardless of the particular CAM architecture, some applications that process CAM search results may only need the search results for a subset of the CAM entries. For example, some applications may discard or ignore hit/miss search results for certain portions of particular CAM entries while using the search results associated with other portions of the entries. One conventional approach for ignoring hit/miss search results for particular CAM cells is to disconnect CAM cells not of interest from their respective match lines. For example, a transistor device may be placed in series between the output node of a CAM cell and its respective match line. When the transistor is switched off, the CAM cell is decoupled from its match line. As such, the content of the CAM cell does not affect the state of the CAM cell's match line. That is, the match line remains in its pre-evaluation state, e.g., pre-charged high state regardless of whether its corresponding CAM cell contains matching data or not. However, power is consumed pre-charging the CAM cell's match line during the pre-evaluation period even though the search results associated with that CAM cell will be ignored. In addition, when the gating transistor is switched on, the transistor couples the output node of the CAM cell to the match line. Such a configuration adds additional capacitance to the output node of CAM cells, thus slowing match line operations and consuming additional power.

Another conventional approach for ignoring particular search results in multi-level hierarchical CAMs is to disable the global match line enable circuitry associated with local match lines not of interest. For example, the clock signal that controls whether a pre-charged global match line may be discharged is gated by an enable signal. If the clock signal is disabled, the global match line remains in its pre-charged state regardless of the state of the local match lines coupled to it. As a result, only global match lines that are enabled during a CAM evaluation period are affected by the state of their corresponding local match lines. Power is still consumed pre-charging the corresponding global and local match lines when the global match line enable circuitry is disabled.

SUMMARY OF THE DISCLOSURE

According to the methods and apparatus taught herein, a Content Addressable Memory (CAM) circuit includes match line restoration circuitry configured to prevent at least one match line within a first group of match lines from being restored to a pre-evaluation state in response to enable information associated with the at least one match line.

Enable information received or otherwise acquired by the match line coupling circuitry indicates which match lines are not of interest. In one embodiment, the enable information directly indicates which match lines are not of interest. In another embodiment, the enable information indirectly indicates which match lines are not of interest, e.g., by identifying match lines of interest. Regardless, the enable information may comprise any information suitable for indicating whether particular CAM match lines are of interest or not, e.g., a care/don't care indicator, one or more masking bits, one or more valid/invalid bits, etc.

In addition to preventing restoration of certain match lines and thereby saving power, the match line coupling circuitry also decouples corresponding higher-level match lines from match lines identified as not being of interest. This prevents unpredictable behavior when particular lower-level match lines are not restored to their pre-evaluation state as part of the above power-saving operations.

According to one embodiment of reducing power consumption in a multi-level hierarchical CAM circuit, enable information associated with one or more CAM match lines included in the multi-level hierarchical CAM circuit is acquired. Individual ones of the CAM match lines are prevented from being restored to a pre-evaluation state responsive to the enable information. According to one embodiment of a multi-level hierarchical CAM circuit, the CAM circuit comprises a plurality of lower-level match lines, a plurality of higher-level match lines and match line restoration circuitry. The lower-level match lines are configured to be restored to a pre-evaluation state during a pre-evaluation period. The higher-level match lines are configured to capture an evaluation state of respective groups of one or more of the lower-level match lines during an evaluation period and to be restored to a pre-evaluation state during the pre-evaluation period. The match line restoration circuitry is configured to prevent at least one of the lower-level match lines from being restored to the pre-evaluation state responsive to corresponding enable information, such as where the match line is recognized as corresponding to don't care (masked) or invalid content.

The multi-level hierarchical CAM circuit may be included in or associated with various kinds of memory devices such as caches and buffers. According to one embodiment of a Translation Lookaside Buffer (TLB), the TLB comprises a multi-level hierarchical CAM circuit having a plurality of entries and corresponding match lines. The multi-level hierarchical CAM circuit is configured to store enable information associated with the entries and to translate virtual memory addresses to corresponding physical memory addresses. The enable information in the present TLB context corresponds to one or more bits that indicate the validity of the TLB entries. The multi-level hierarchical CAM circuit is configured to prevent individual ones of the match lines from being restored to a pre-evaluation state responsive to the enable information.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
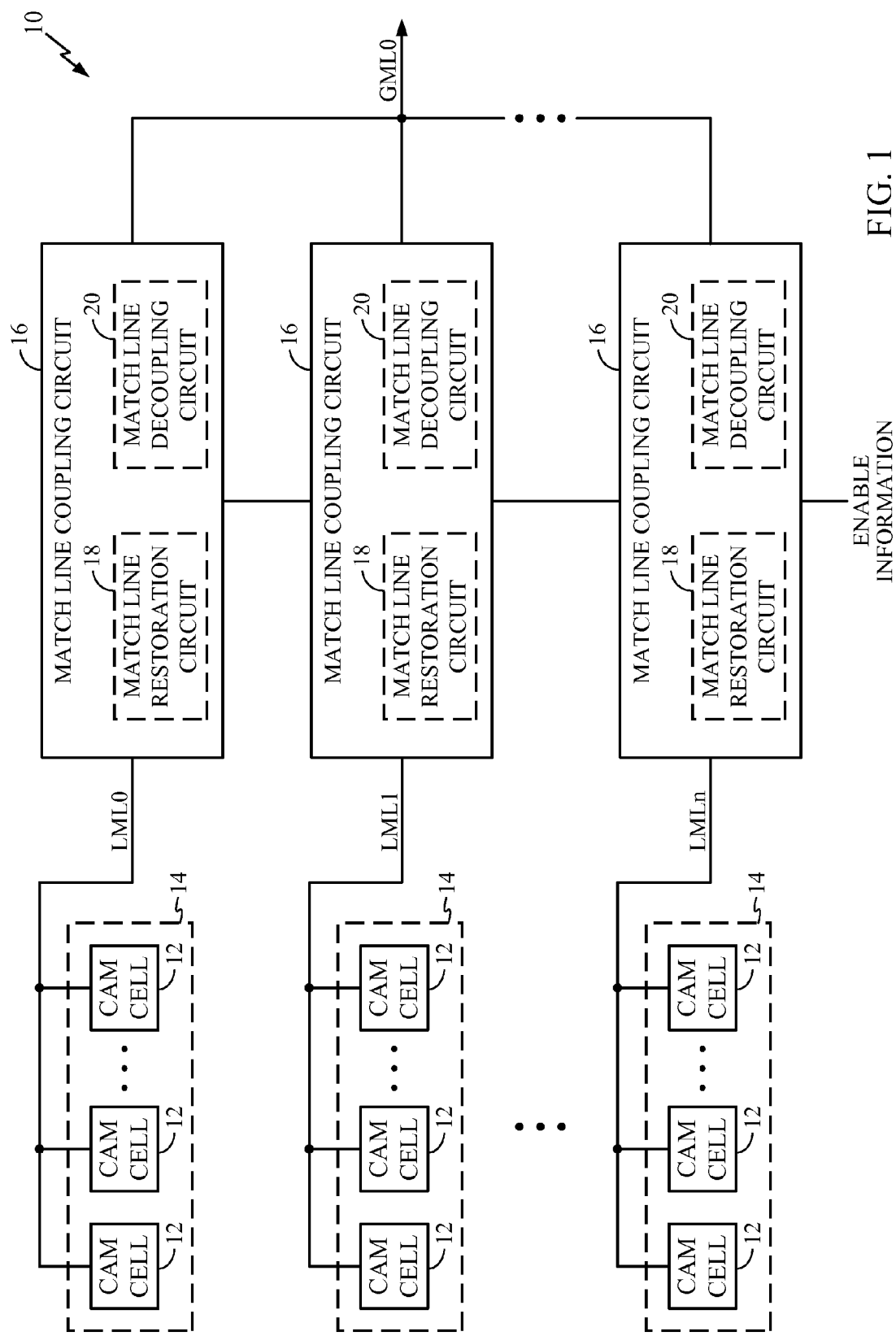
FIG. 1 is a partial block diagram illustrating an embodiment of a multi-level hierarchical Content Addressable Memory (CAM) circuit having match line coupling circuitry that reduces power consumption.

FIG. 1 partially illustrates an embodiment of a multi-level hierarchical Content Addressable Memory (CAM) circuit 10 that reduces power consumption during CAM operations. The CAM circuit 10 has multiple memory cells 12 such as binary or ternary CAM cells for storing data. The CAM cells 12 are arranged in groups 14. Each CAM cell 12 in a group 14 is coupled to a Local Match Line (LML). Circuitry 16 included in the CAM circuit 10 couples related LMLs to a higher-level match line, e.g., LML0 through LMLn are coupled to a Global Match Line (GML0) in FIG. 1. In one embodiment, related LMLs are directly coupled to a GML via the match line coupling circuitry 16. According to this embodiment, the CAM circuit 10 comprises two hierarchical levels of match lines (local and global match lines). In another embodiment, related LMLs are coupled to an Intermediary Match Line (IML). Related IMLs are then directly or indirectly coupled to a corresponding GML. According to this embodiment, the CAM circuit 10 comprises more than two hierarchical levels of match lines (LMLs, at least one level of IMLs, and GMLs).

Regardless of the number of match line levels, the match line coupling circuitry 16 comprises match line restoration circuitry 18 and match line decoupling circuitry 20. For ease of explanation only, the match line coupling circuitry 16 is next described with reference to coupling LMLs to GMLs. However, those skilled in the art will readily recognize that the coupling circuitry 16 described herein may couple any hierarchically lower level of match lines to a higher level match line.

With this in mind, the match line restoration circuitry 18 determines whether particular LMLs are to be restored to a pre-evaluation state after a CAM search operation. That is, not all LMLs may be of interest during a particular CAM search operation. For example, the content one or more CAM entries (not shown) or portions of CAM entries may be marked as invalid or masked during evaluation. LMLs corresponding to these entries or partial entries are not of interest. Search results provided by LMLs not of interest are conventionally ignored or discarded during a CAM search operation. Enable information, e.g., one or more valid or masking bits associated with each CAM entry is provided to the match line restoration circuitry 18 for indicating which LMLs are not of interest. In one embodiment, the enable information directly indicates which match lines are not of interest. In another embodiment, the enable information indirectly indicates which match lines are not of interest, e.g., by identifying match lines of interest. Regardless, the match line restoration circuitry 18 uses the enable information to identify the match lines that will be ignored during a CAM search operation.

If a particular match line restoration circuit 18 determines that its corresponding LMLs are not of interest, it prevents those LMLs from being restored to a pre-evaluation state, essentially disabling the LMLs. In one embodiment, the match line restoration circuit 18 prevents the LMLs from being pre-charged. In another embodiment, the match line restoration circuit 18 prevents the LMLs from being pre-discharged. Because the search results associated with these LMLs are not of interest, preventing their restoration to a pre-evaluation state reduces power consumption without adversely affecting operation of the CAM circuit 10. The enable information used by the match line restoration circuitry 18 may be stored within the CAM circuit 10, e.g., as one or more valid bits included in each entry in the CAM circuit 10, or may be provided to the CAM circuit 10.

The enable information is also used by the match line decoupling circuitry 20. The match line decoupling circuitry 20 uses the enable information to prevent LMLs not of interest from affecting their corresponding GMLs. Decoupling an LML not of interest from its GML ensures that the LML will not affect the state of its GML. Instead, only enabled LMLs coupled to the GML may affect the state of the GML, e.g., by discharging it. This prevents unstable CAM circuit 10 behavior while reducing power consumption.

In one embodiment, the match line decoupling circuitry 20 prevents a group of LMLs that have been disabled by the match line restoration circuitry 18 from affecting the state of the GML to which they are coupled. If the enable information indicates that a group of LMLs associated with a particular GML are to be ignored during a CAM search operation, then the match line decoupling circuitry 20 decouples the group of LMLs from that GML. As such, the match line decoupling circuitry 20 prevents individual groups of LMLs from affecting the state of corresponding GMLs when the LMLs are not of interest.

Figure 2:
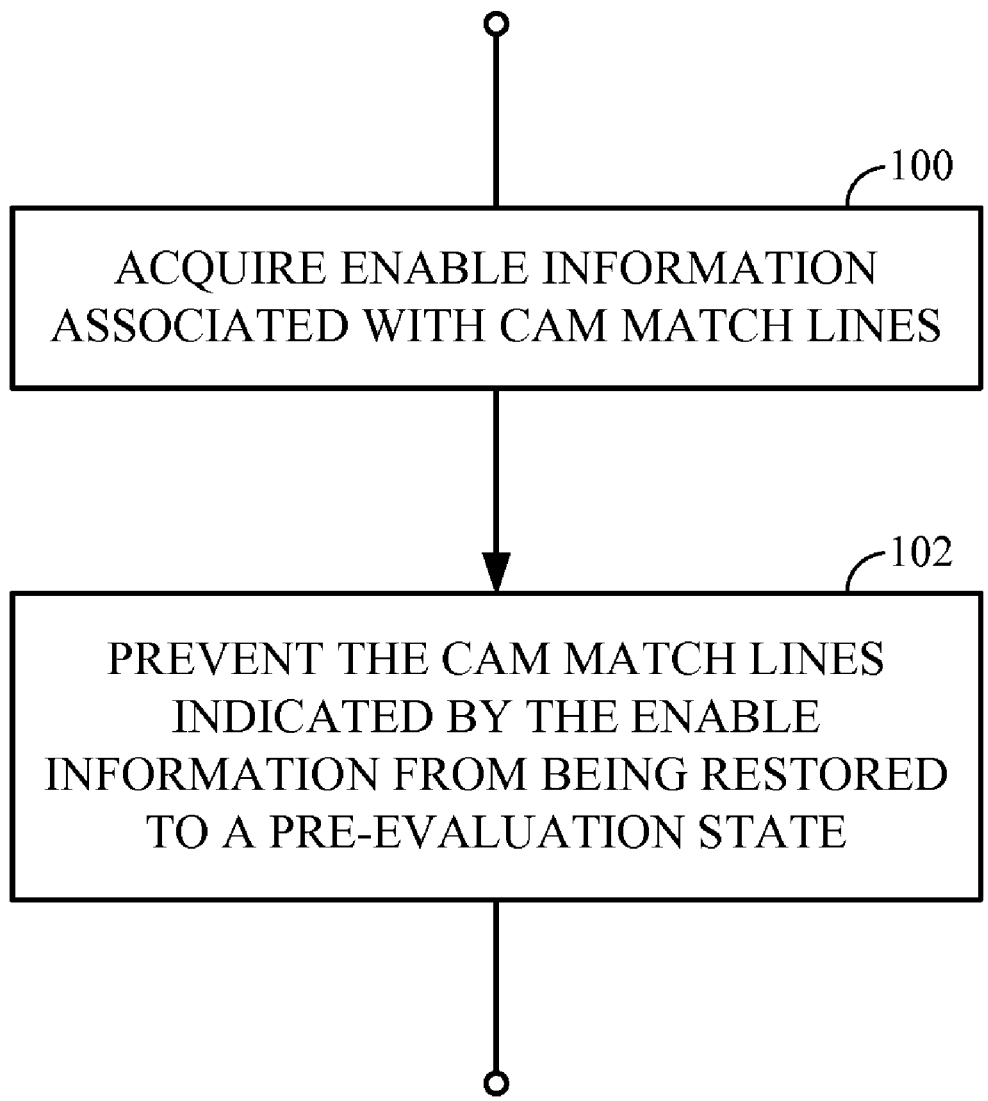
FIG. 2 is a logic flow diagram illustrating an embodiment of program logic for reducing power consumption in a multi-level hierarchical CAM circuit.

The following is a non-limiting example based on the CAM circuit 10 shown in FIG. 1 for demonstrating how the match line restoration and decoupling circuitry 18, 20 functions during a CAM search operation. During a pre-evaluation period of the CAM search operation, the CAM circuit 10 acquires match line enable information, as illustrated by Step 100 of FIG. 2. In one embodiment, the CAM circuit 10 accesses a location in each entry of the CAM circuit 10 to acquire a corresponding valid bit that indicates validity of the entries. In the present example, the enable information indicates that all LMLs except for LML1 are of interest. Based on the enable information, the match line restoration circuit 18 associated with LML1 prevents LML1 from being restored to its pre-evaluation state while the other match line restoration circuits 18 enable restoration of their corresponding LMLs, as illustrated by Step 102 of FIG. 2. In addition, the match line decoupling circuit 20 associated with LML1 prevents LML1 from affecting the state of GML0 during the subsequent evaluation period. Thus, the state of GML0 may be affected by each LML except LML1.

Figure 3:
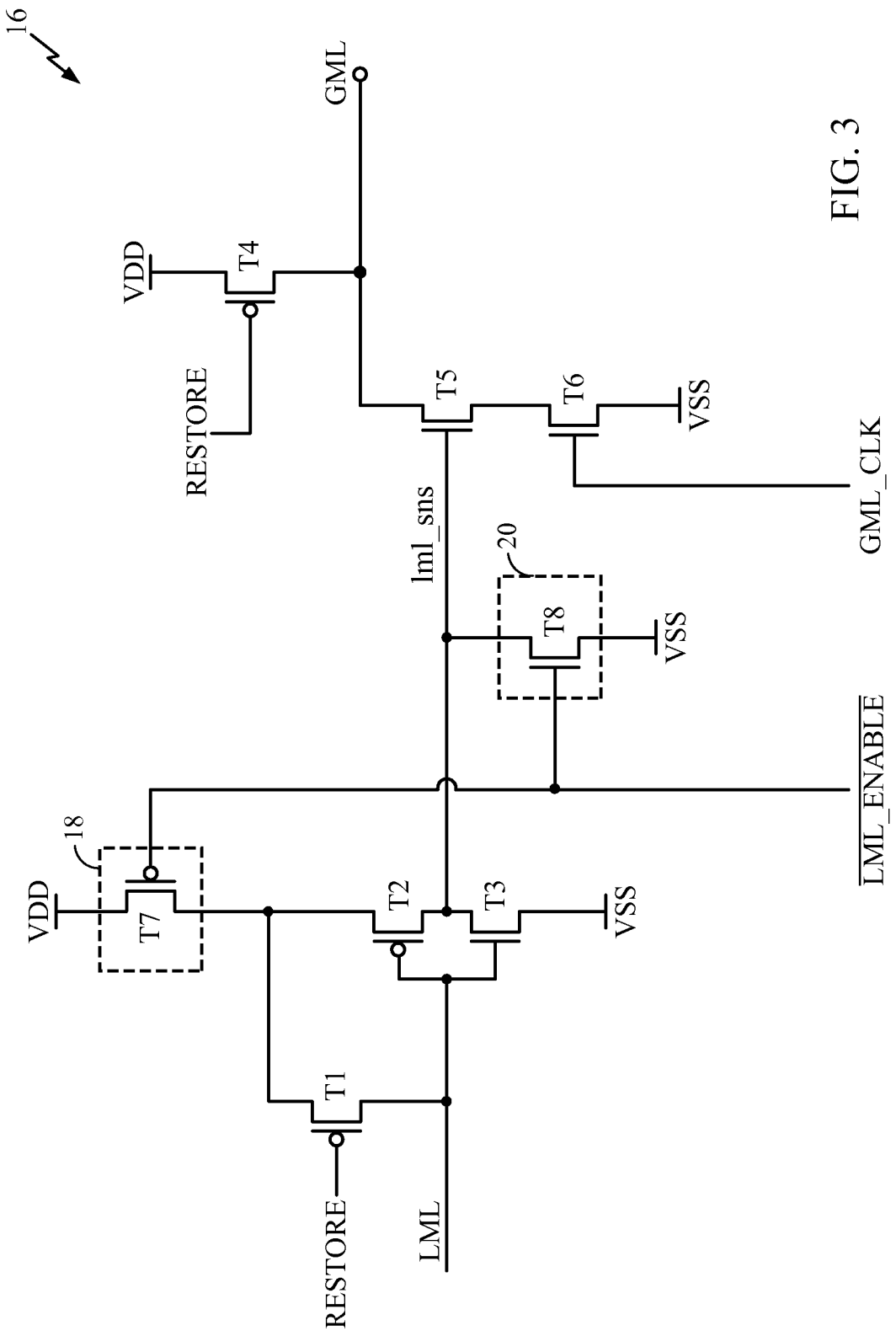
FIG. 3 is a block diagram illustrating one embodiment of match line coupling circuitry included in a multi-level hierarchical CAM.

FIG. 3 illustrates one embodiment of the match line coupling circuitry 16 included in the CAM circuit 10. The match line coupling circuitry 16 includes an LML precharge circuit (p-FET T1), an inverter (p-FET T2 and n-FET T3), a GML precharge circuit (p-FET T4), and a GML evaluation circuit (n-FETs T5 and T6). The match line coupling circuitry 16 also includes the match line restoration and decoupling circuitry 18, 20. According to this embodiment, the match line restoration circuit 18 comprises a p-FET transistor (T7) coupled between a voltage source ($V_{dd}$) and the source nodes of the LML precharge circuit and the inverter. The match line decoupling circuit 20 comprises an n-FET transistor (T8) coupled to one gate input of the GML evaluation circuit. The gates of the match line restoration and decoupling circuits 18, 20 are controlled by an enable signal (LML_ENABLE).

The enable signal indicates whether the LML is of interest or not. When the enable signal is a logic one, it causes precharging of the LML to be disabled and causes the LML to be decoupled from its GML. Particularly, if the enable signal indicates that the search results associated with the LML are of interest, the match line restoration circuit 18 is activated (e.g., p-FET transistor T7 is switched on). When activated, the match line restoration circuit 18 enables the LML precharge circuit and the inverter by charging their respective source nodes to a logic one value ($V_{dd}$). This enables the LML precharge circuit to pre-charge the LML to a logic one value in response to an active restore signal (RESTORE) during a pre-evaluation period. Unlike some conventional circuit techniques, the match line restoration circuit 18 does not adversely impact performance of the CAM circuit 10 when activated. Particularly, the match line restoration circuit does not add additional capacitance to the output node of the CAM cell (not shown) coupled to the LML when activated. Because the match line restoration circuit 18 is not placed in the active signal path coupling the LML to the output node of the CAM cell, no additional capacitive loading results.

When the LML is of interest, the enable signal also causes the match line decoupling circuit 20 to be deactivated (e.g., n-FET transistor T8 is switched off). When the match line decoupling circuit 20 is deactivated, the state of the GML is affected by the LML. As a result, when the n-FET transistor T6 of the GML evaluation circuit is activated in response to an enabled clock signal (GML_CLK), the state of the LML controls whether the n-FET transistor T5 of the GML evaluation circuit is switched on or off. If the n-FET transistor T5 is switched on, the GML discharges to ground. Conversely, the GML remains unaffected by the LML irrespective of the LML's state when the n-FET transistor T5 is switched off. As a result, the match line decoupling circuit 20 does not affect the GML state when deactivated. Instead, the state of the GML reflects that of only the enabled LMLs.

If the LML is not of interest, the match line restoration circuit 18 is deactivated (e.g., p-FET transistor T7 is switched off). When deactivated, the match line restoration circuit 18 decouples the source nodes of the LML precharge circuit and the inverter from the power source. The LML precharge circuit is unable to pre-charge the LML when the power source is removed from its source node, thus reducing unnecessary power consumption. Further, the LML is disabled when the match line restoration circuit 18 is deactivated.

In addition, the enable signal causes the match line decoupling circuit 20 to be activated when the LML is disabled. The match line decoupling circuit 20 drives the gate input to the n-FET transistor T5 of the GML evaluation circuit to a logic low value ($V_{ss}$). When the gate input of the n-FET transistor T5 is low, the state of the LML does not affect that of the GML, and thus the LML is decoupled from its GML. Particularly, the n-FET transistor T5 cannot conduct sufficient current when its gate input is low. As such, the GML, which had been pre-charged during a prior non-evaluation period, cannot be discharged by this particular GML evaluation circuit regardless of the LML's state. When activated, the match line decoupling circuit 20 also prevents unpredictable behavior by the CAM circuit 10 by pulling down the gate input of the n-FET transistor T5 of the GML evaluation circuit. If the gate input of the n-FET transistor T5 is not pulled down, the output node of the inverter (lml_sns) could adversely affect the GML state. For example, the output node of the GML's inverter may float or otherwise act unpredictably when the power source has been removed from its source node. The match line decoupling circuit 20 prevents such sporadic behavior from adversely affecting the GML by preventing the LML from affecting the state of the GML when the LML is not of interest.

Figure 4:
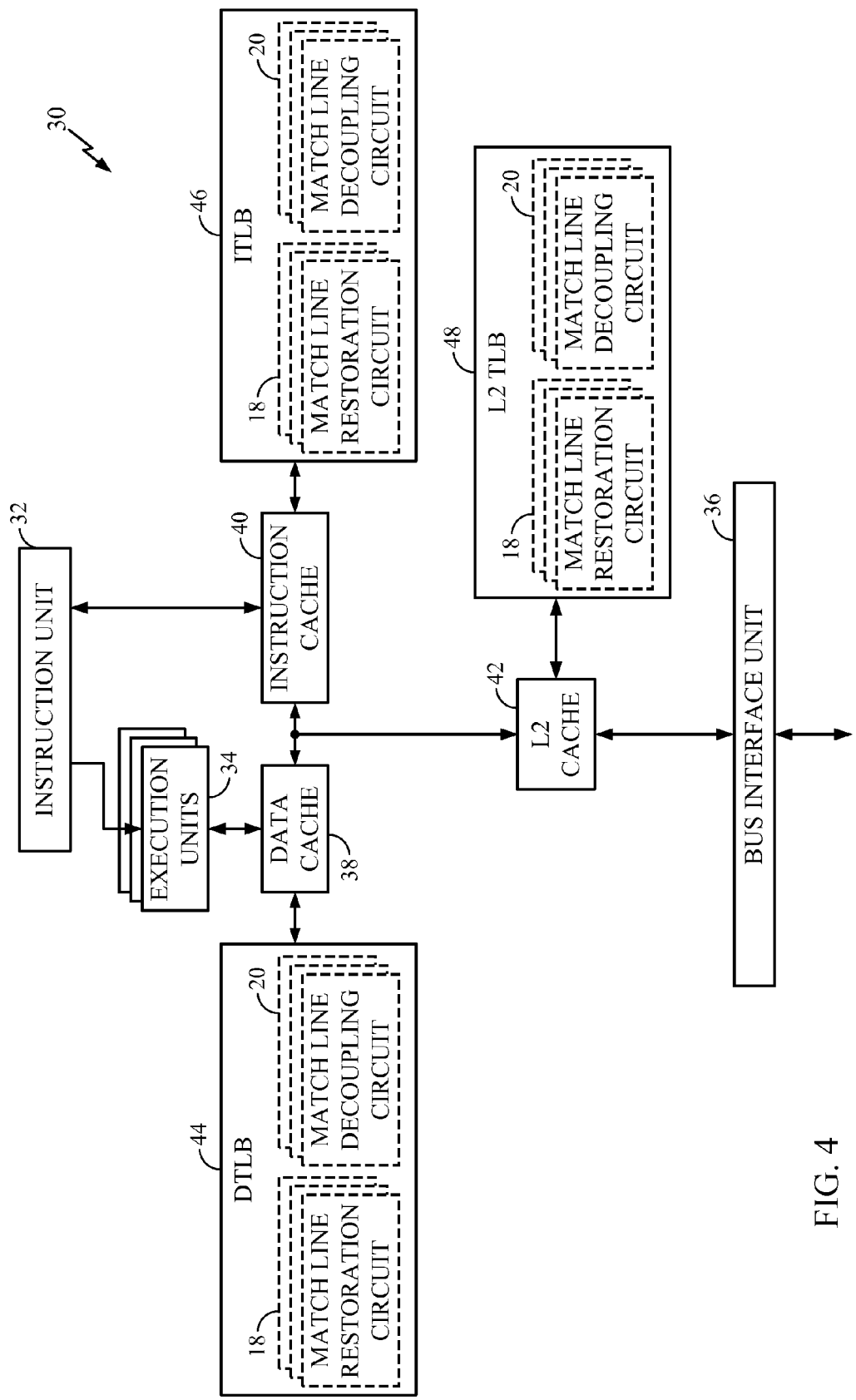
FIG. 4 is a block diagram illustrating an embodiment of a microprocessor including CAM match line coupling circuitry.

The match line restoration and decoupling circuitry 18, 20 may be included in or associated with various kinds of memory devices such as caches and buffers. FIG. 4 illustrates one embodiment of a microprocessor 30 having CAM or CAM-like circuitry that includes one or more instances of the match line restoration and decoupling circuitry 18, 20. In more detail, the microprocessor 30 includes an instruction unit 32, one or more execution units 34, a bus interface unit 36, a data cache 38, an instruction cache 40 and a higher-level (L2) cache 42. The instruction unit 32 provides centralized control of instruction flow to the execution units 34. The execution units 34 execute instructions dispatched by the instruction unit 32. The bus interface unit 36 provides a mechanism for transferring data, instructions, addresses, and control signals to and from the microprocessor 30. The data and instruction caches 38, 40 store data and instructions, respectively. The L2 cache 42 provides a high-speed memory buffer between the data and instruction caches 38, 40 and memory (not shown) external to the microprocessor 30.

The caches 38, 40 and 42 have respective Translation Lookaside Buffers (TLBs) 44, 46 and 48 for performing address translation during cache access operations. Each TLB 44, 46 and 48 has one or more instances of the match line restoration and decoupling circuitry 18, 20. Alternatively, a unified TLB (not shown) may perform address translation for the caches 38, 40 and 42. Regardless, the TLBs 44, 46 and 48 are CAM-based in that a virtual address of interest is provided to the TLBs 44, 46 and 48 and the TLBs 44, 46 and 48 yield corresponding hit or miss results in response. In the event of a hit, a physical address is produced corresponding to the virtual address search field. In the event of a miss, a page table transaction occurs.

The TLBs 44, 46 and 48 have entries (not shown) that contain information for use in translating virtual address to physical addresses. In one embodiment, each TLB entry comprises a virtual address field, a corresponding physical address field and a valid bit. If a virtual address search field matches an entry in one of the TLBs 44, 46 and 48, the corresponding physical address field is output. Otherwise, a page table transaction occurs. The valid bit determines whether a particular TLB entry is valid or not. If invalid, the entry contents are ignored or discarded during address translation. Other enable bits such as page-size bits may determine whether corresponding portions of virtual address bits should participate in address translation.

Figure 5:
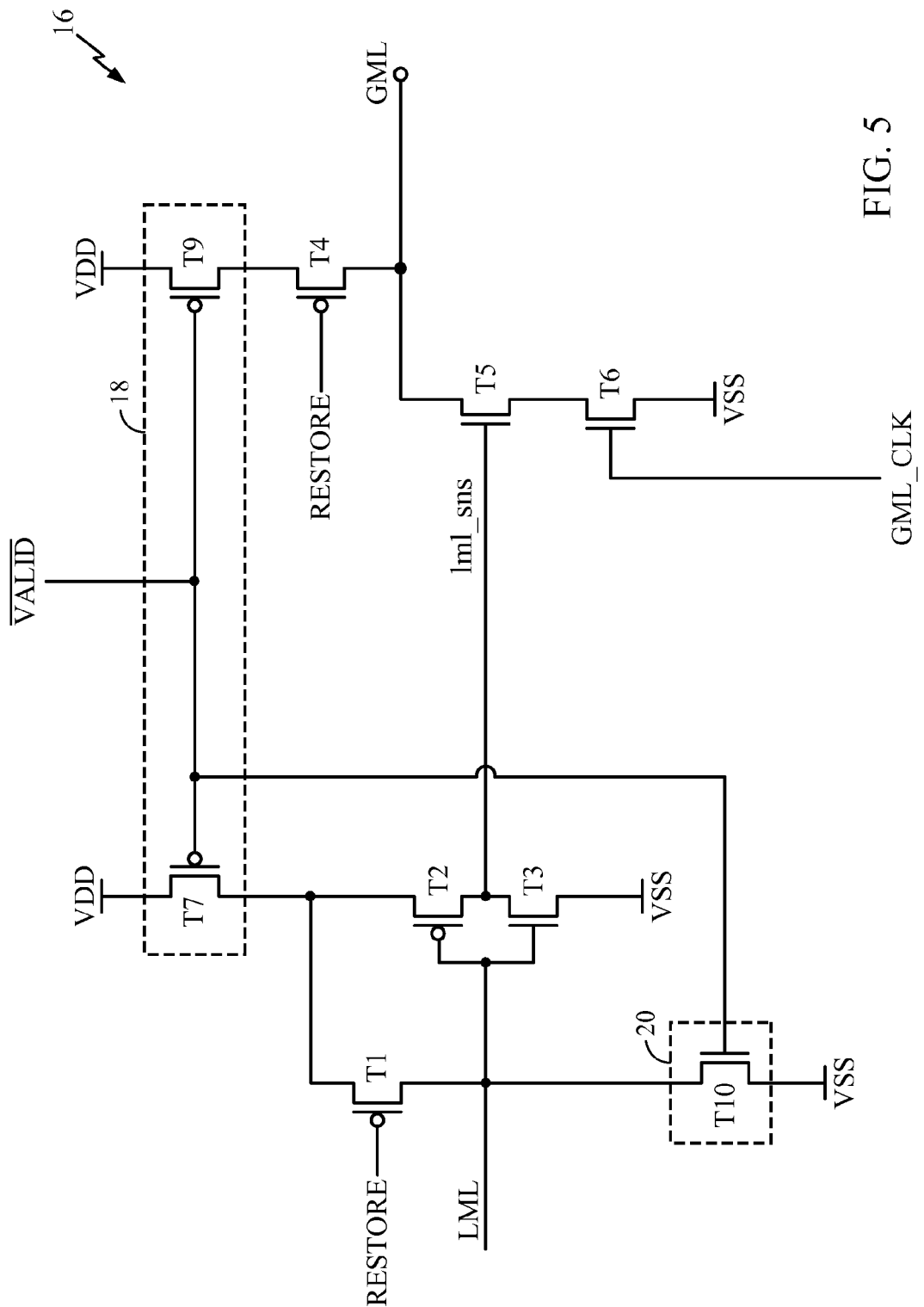
FIG. 5 is a block diagram illustrating another embodiment of match line coupling circuitry included in a multi-level hierarchical CAM.

FIG. 5 illustrates one embodiment of the match line coupling circuitry 16 for use in the TLBs 44, 46 and 48. According to this embodiment, a valid bit (VALID) retrieved from a TLB 44, 46 and 48 entry controls operation of the match line restoration and decoupling circuitry 18, 20. When a particular TLB 44, 46 and 48 entry is valid, its valid bit causes corresponding match line restoration circuitry 18 to be enabled. When enabled, the match line restoration circuitry 18 restores its LML to a pre-evaluation state after a TLB search operation. Also, the restoration circuit 18 includes a second p-FET transistor (T9) for pre-charging the corresponding GML when enabled. Conversely, when the valid bit indicates that the entry is invalid, the LML is decoupled from its GML.

According to this embodiment, the LML is decoupled from its GML when the p-FET 10 of the match line decoupling circuitry 10 drives the input to the GML inverter circuit (p-FET T2 and n-FET T3) to a logic low value ($V_{ss}$). When the match line decoupling circuit 20 drives the inverter input to a logic low state, the LML is effectively decoupled from its GML. That is, the LML no longer has an affect on the state of the GML since the inverter outputs a logic one irrespective of the LML state. By driving the inverter input to a logic low state, the GML discharges when its clock input signal (GML_CLK) is active. When the GML is discharged, it is interpreted as a mismatch. Thus, this embodiment of the coupling circuitry 16 prevents false hits from being processed when a TLB 44, 46 and 48 entry is invalid. Alternatively, the coupling circuitry 16 embodiment illustrated in FIG. 3 may be included in the TLBs 44, 46 and 48 for preventing restoration of invalid LMLs and decoupling invalid LMLs from their corresponding GMLs.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
   acquiring enable information associated with one or more content addressable memory (CAM) match lines included in a CAM circuit; and
   preventing at least one of the one or more CAM match lines from being restored to a pre-evaluation state responsive to the enable information.

2. The method of claim 1, wherein preventing the at least one CAM match line from being restored to the pre-evaluation state comprises preventing match line pre-charging of the at least one CAM match line.

3. The method of claim 1, wherein preventing the at least one CAM match line from being restored to the pre-evaluation state comprises preventing match line pre-discharging of the at least one CAM match line.

4. The method of claim 1, wherein preventing the at least one CAM match line from being restored to the pre-evaluation state comprises disabling circuitry configured to restore the at least one CAM match line to the pre-evaluation state.

5. The method of claim 1, wherein the CAM circuit comprises a multi-level hierarchical CAM circuit.

6. The method of claim 5, wherein the at least one CAM match line prevented from being restored to the pre-evaluation state comprises one of a local CAM match line and an intermediary CAM match line.

7. The method of claim 5, further comprising preventing the at least one CAM match line from affecting a pre-evaluation state of a corresponding higher-level CAM match line in response to the enable information.

8. The method of claim 7, wherein preventing the at least one CAM match line from affecting a pre-evaluation state of a corresponding higher-level CAM match line comprises enabling circuitry configured to decouple the at least one CAM match line from the corresponding higher-level CAM match line.

9. The method of claim 7, wherein the corresponding higher-level CAM match line comprises one of an intermediary CAM match line and a global CAM match line.

10. The method of claim 7, wherein the enable information comprises one or more bits that indicate whether search results associated with the at least one CAM match line are to be utilized.

11. The method of claim 1, wherein acquiring the enable information and preventing the at least one of the one or more CAM match lines from being restored to a pre-evaluation state are performed at a processor.

12. The method of claim 11, wherein the CAM circuit is integrated into an electronic device.

13. The method of claim 1, wherein the enable information is determined based on CAM circuit entries.

14. The method of claim 13, wherein the enable information is determined based on validity of the CAM circuit entries.

15. The method of claim 14, wherein the validity of the CAM circuit entries is determined during a pre-evaluation period.

* * * * *